(12) United States Patent
James et al.

(10) Patent No.: US 10,285,309 B2
(45) Date of Patent: May 7, 2019

(54) SUBMERGED DATACENTER

(71) Applicant: Microsoft Technology Licensing, LLC, Redmond, WA (US)

(72) Inventors: Sean James, Olympia, WA (US); Todd Robert Rawlings, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/481,427

(22) Filed: Apr. 6, 2017

(65) Prior Publication Data

US 2017/0215299 A1    Jul. 27, 2017

Related U.S. Application Data

(63) Continuation of application No. 14/319,926, filed on Jun. 30, 2014, now Pat. No. 9,655,283.

(51) Int. Cl.
| H05K 7/00 | (2006.01) |
|---|---|
| H05K 7/20 | (2006.01) |
| F03B 13/22 | (2006.01) |
| F03B 13/26 | (2006.01) |
| F03B 13/10 | (2006.01) |
| H05K 7/14 | (2006.01) |

(Continued)

(52) U.S. Cl.
CPC ......... *H05K 7/20709* (2013.01); *F03B 13/10* (2013.01); *F03B 13/22* (2013.01); *F03B 13/26* (2013.01); *F03D 9/25* (2016.05); *G01M 3/3263* (2013.01); *G01M 3/40* (2013.01); *H05K 7/1497* (2013.01); *H05K 7/20* (2013.01); *H05K 7/2079* (2013.01); *Y02E 10/28* (2013.01); *Y02E 10/38* (2013.01); *Y02P 80/158* (2015.11)

(58) Field of Classification Search
CPC .................................................... H05K 7/1497
USPC ...................................................... 361/679.01
See application file for complete search history.

(56) References Cited

U.S. PATENT DOCUMENTS

| 1,757,174 A | 6/1930 | Douglas |
|---|---|---|
| 2,870,729 A | 1/1959 | Shannon et al. |

(Continued)

FOREIGN PATENT DOCUMENTS

| CN | 201846435 U | 5/2011 |
|---|---|---|
| CN | 102160171 A | 8/2011 |

(Continued)

OTHER PUBLICATIONS

Markoff, John, "Microsoft Plumbs Ocean's Depths to Test Underwater Data Center", Published on: Jan. 31, 2016, 5 pages.Available at:http://www.nytimes.com/2016/02/01/technology/microsoft-plumbs-oceans-depths-to-test-underwater-data-center.html?_r=2.

(Continued)

*Primary Examiner* — Jerry Wu

(57) ABSTRACT

The subject disclosure is directed towards a submerged datacenter, which may be made up of modules, into a body of water such as the ocean. The submersion facilitates cooling of the datacenter as well as providing protection of the datacenter from environmental conditions that exist at or near the surface. Power may be generated from the datacenter heat, and power generated by or near the body of water (e.g., via waves, tides, wind, currents, temperature differences) may be used to help power the datacenter.

20 Claims, 10 Drawing Sheets

(51) Int. Cl.
F03D 9/25 (2016.01)
G01M 3/32 (2006.01)
G01M 3/40 (2006.01)

(56) References Cited

U.S. PATENT DOCUMENTS

| | | | |
|---|---|---|---|
| 4,411,213 A * | 10/1983 | Laukien | B63B 1/12 114/312 |
| 5,511,504 A | 4/1996 | Martin | |
| 6,186,702 B1 | 2/2001 | Bartkowski | |
| 6,549,869 B1 | 4/2003 | Piety | |
| 6,636,565 B1 | 10/2003 | Kim | |
| 7,525,207 B2 | 4/2009 | Clidaras et al. | |
| 8,549,869 B1 | 10/2013 | Whitted et al. | |
| 8,636,565 B2 | 1/2014 | Carlson et al. | |
| 8,853,872 B2 | 10/2014 | Clidaras et al. | |
| 8,854,809 B2 | 10/2014 | Neumann et al. | |
| 2008/0055850 A1 | 3/2008 | Carlson et al. | |
| 2008/0209234 A1 | 8/2008 | Clidaras et al. | |
| 2009/0078401 A1 | 3/2009 | Cichanowicz | |
| 2009/0229194 A1 | 9/2009 | Armillas | |
| 2009/0295167 A1 * | 12/2009 | Clidaras | F03B 13/20 290/55 |
| 2009/0297270 A1 | 12/2009 | Black et al. | |
| 2010/0073012 A1 * | 3/2010 | Inoue | H02K 11/20 324/551 |
| 2011/0132579 A1 * | 6/2011 | Best | H05K 7/20763 165/104.31 |
| 2011/0154842 A1 | 6/2011 | Heydari et al. | |
| 2011/0240497 A1 | 10/2011 | Dechene et al. | |
| 2011/0247348 A1 | 10/2011 | Mashiko et al. | |
| 2012/0232879 A1 | 9/2012 | Iyengar et al. | |
| 2013/0044426 A1 | 2/2013 | Neumann et al. | |
| 2013/0058029 A1 | 3/2013 | Ootani et al. | |
| 2013/0125825 A1 | 5/2013 | Kania et al. | |
| 2013/0190941 A1 | 7/2013 | Cader et al. | |
| 2015/0029658 A1 * | 1/2015 | Yairi | G06F 1/20 361/679.47 |
| 2015/0194813 A1 * | 7/2015 | Finn | H05K 7/1497 307/19 |
| 2015/0321739 A1 | 11/2015 | Dehlsen | |
| 2015/0382511 A1 | 12/2015 | James et al. | |
| 2015/0382515 A1 | 12/2015 | James et al. | |

FOREIGN PATENT DOCUMENTS

| | | |
|---|---|---|
| CN | 102342191 A | 2/2012 |
| DE | 102011115657 A1 | 3/2013 |
| JP | 2006084038 A | 3/2006 |
| KR | 20130079106 A * | 7/2013 |
| RU | 2500013 C1 | 11/2013 |
| WO | 2009108070 A1 | 9/2009 |
| WO | 2012129612 A1 | 10/2012 |
| WO | 2012162986 A1 | 12/2012 |
| WO | 2013184820 A1 | 12/2013 |
| WO | 2014039212 A1 | 3/2014 |
| WO | 2014120275 A1 | 8/2014 |

OTHER PUBLICATIONS

Callahan, Emily, "Artificial Reefing—The Blue Solution to America's Aging Infrastructure?", Published on: Nov. 6, 2014, 9 pages. Available at:http://voices.nationalgeographic.com/2014/11/06/artificial-reefing-the-blue-solution-to-americas-aging-infrastructure/.

Matteson, et al., "Maximizing Data Center Energy Efficiency by Utilizing New Thermal Management and Acoustic Control Methodology", In International Technical Conference and Exhibition on Packaging and Integration of Electronic and Photonic Microsystems, vol. 2, Jul. 16, 2013, 1 page.

Toma, et al., "Study on Heat Dissipation and Cooling Optimization of the Junction Box of OBSEA Seafloor Observatory", In Proceedings of IEEE/ASME Transactions on Mechatronics, vol. 20, Issue 3, Jun. 2015, pp. 1301-1309.

Masaki, et al., "Underwater Surveillance System to Counteract Associated Underwater Threats", In NEC Technical Journal, vol. 8, Issue 1, Sep. 2013, pp. 63-67.

Felemban, Emad, "Advanced Border Intrusion Detection and Surveillance Using Wireless Sensor Network Technology ", In International Journal of Communications, Network and System Sciences, vol. 6, Issue 5, May 2013, pp. 251-259.

Casari, Paolo, "Using Sound to create Underwater Networks", Published on: May 29, 2015, 3 pages. Available at: http://phys.org/wire-news/194344776/using-sound-to-create-underwater-networks.html.

Murad, et al., "A Survey on Current Underwater Acoustic Sensor Network Applications", In International Journal of Computer Theory and Engineering, vol. 7, Issue 1, Feb. 2015, pp. 51-56.

Laumer, John, "Google Floats A Data Center Patent: Offshore, Ocean-Cooled, Wave-Powered, and Modular", Published on: Sep. 20, 2008, 4 pages. Available at:http://www.treehugger.com/corporate-responsibility/google-floats-a-data-center-patent-offshore-ocean-cooled-wave-powered-and-modular.html.

Fletcher, Joanna, "What Happened to Google's Floating Data Center?", Published on: Dec. 4, 2010, 2 pages.Available at:http://www.hostway.com/web-resources/find-web-hosting/what-happened-to-googles-floating-data-center/.

"International Preliminary Report on Patentability Issued in PCT Application No. PCT/US2015/037848" dated Apr. 21, 2016, 6 pages.

Non-Final Office Action Received for U.S. Appl. No. 14/319,926, dated Apr. 6, 2016, 10 pages.

Final Office Action Received for U.S. Appl. No. 14/319,926, dated Sep. 8, 2016, 11 pages.

Notice of Allowance Received for U.S. Appl. No. 14/319,926, dated Jan. 19, 2017, 9 pages.

Trabish, Herman K., "Ocean Energy to Power Google's Sea-Going Data Center", Published on: Sep. 10, 2008, 4 pages Available at: http://newenergynews.blogspot.in/2008/09/ocean-energy-to-power-googles-sea-going.html.

Miller, Rich, "Google Planning Offshore Data Barges", Published on: Sep. 6, 2008, 5 pages Available at: http://www.datacenterknowledge.com/archives/2008/09/06/google-planning-offshore-data-barges/.

Miller, Rich, "Data Centers on Cargo Ships?", Published on: Jan. 8, 2008, 5 pages Available at: http://www.datacenterknowledge.com/archives/2008/01/08/data-centers-on-cargo-ships/.

"International Search Report & Written Opinion Received for PCT Application No. PCT/US2015/037848" dated Oct. 6, 2015, 10 pages.

Patel, et al., "Thermal Considerations in Cooling Large Scale High Compute Density Data Centers", In the Eighth Intersociety Conference on Thermal and Thermomechanical Phenomena in Electronic Systems, May 2002, 10 pages.

U.S. Appl. No. 13/917,636, Rubenstein, et al., "Renewable Energy Based Datacenter Cooling", filed Jun. 13, 2013, 31 pages.

"International Preliminary Report on Patentability Issued in PCT Application No. PCT/U2015/037847", dated Sep. 21, 2016, 6 Pages.

"Second Written Opinion Issued in PCT Application No. PCT/U2015/037847", dated Jun. 1, 2016, 7 Pages.

"Final Office Action", U.S. Appl. No. 14/272,656, Notification dated Nov. 30, 2015, 11 pages.

"Green (Low Carbon) Data Center Blog, The Under Water Data Center, Response to Risks of Google's Floating Data Center", Submerge, Sep. 12, 2008, 3 pages. Available at: http://www.greenm3.com/gdcblog/2008/9/12/the-under-water-data-center-response-to-risks-googlersquo.html.

U.S. Appl. No. 14/272,656, Dehlsen, "Marine Subsurface Data Center Vessel", filed May 8, 2014, 16 pages.

"International Search Report & Written Opinion Received for PCT Application No. PCT/U2015/037847", dated Nov. 9, 2015, 11 Pages.

"Office Action Issued in Chinese Patent Application No. 201580033891.3", dated Sep. 27, 2018, 6 Pages.(W/o English Translation).

Miller, Rich, "Data Centers on Cargo Ships ?", Retrieved From: https://www.datacenterknowledge.com/archives/2008/01/08/data-centers-on-cargo-ships/, Jan. 8, 2008, 2 Pages.

(56) References Cited

OTHER PUBLICATIONS

Miller, Rich, "Google Planning Offshore Data Barges", Retrieved From: https://www.datacenterknowledge.com/archives/2008/09/06/google-planning-offshore-data-barges/, Sep. 6, 2008, 10 Pages.
"Office Action Issued in Japanese Patent Application No. 2016-570865", dated Jan. 30, 2019, 10 Pages. (Ms# 341558-JP-PCT).
Kinoshita, Atsuhiro, "Research Trends of Emerging Research Devices Except for Super Conductors", In Proceedings of IEICE General Conference published by the IEICE, Japan, Mar. 19, 2013, 4 Pages.
"Office Action Issued in Russian Patent Application No. 2016152250", dated Jan. 31, 2019, 9 Pages. (Ms# 341558-RU-PCT)(W/O English Translation).

* cited by examiner

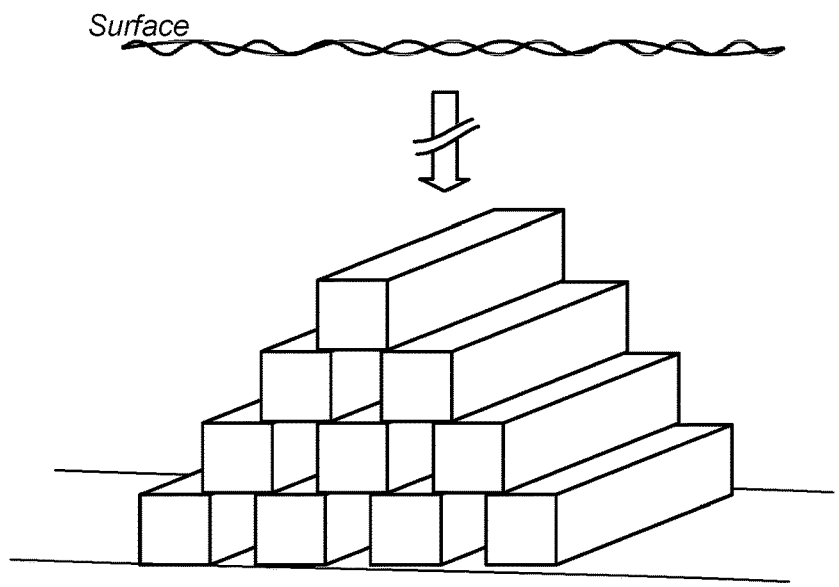
FIG. 3A
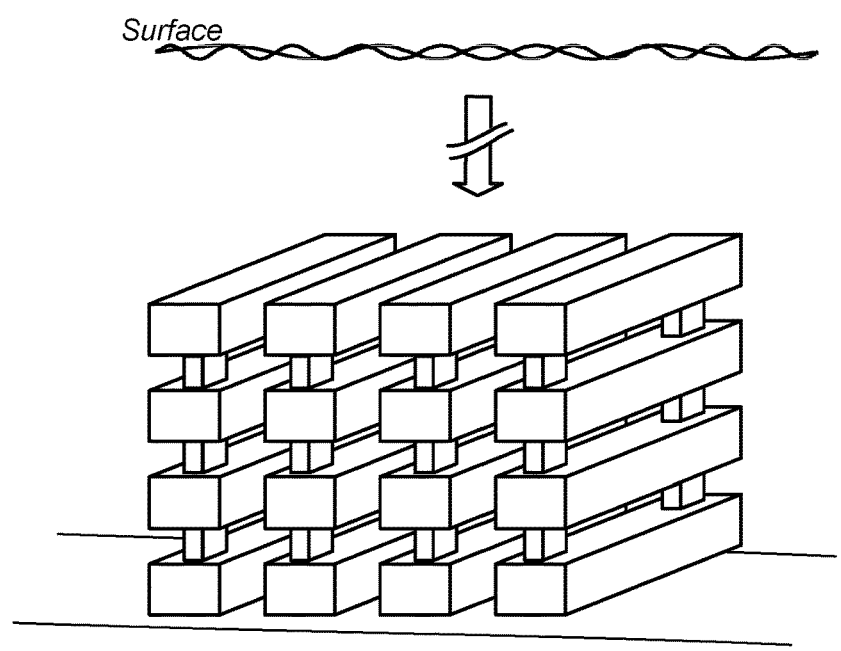
FIG. 3B   Floor

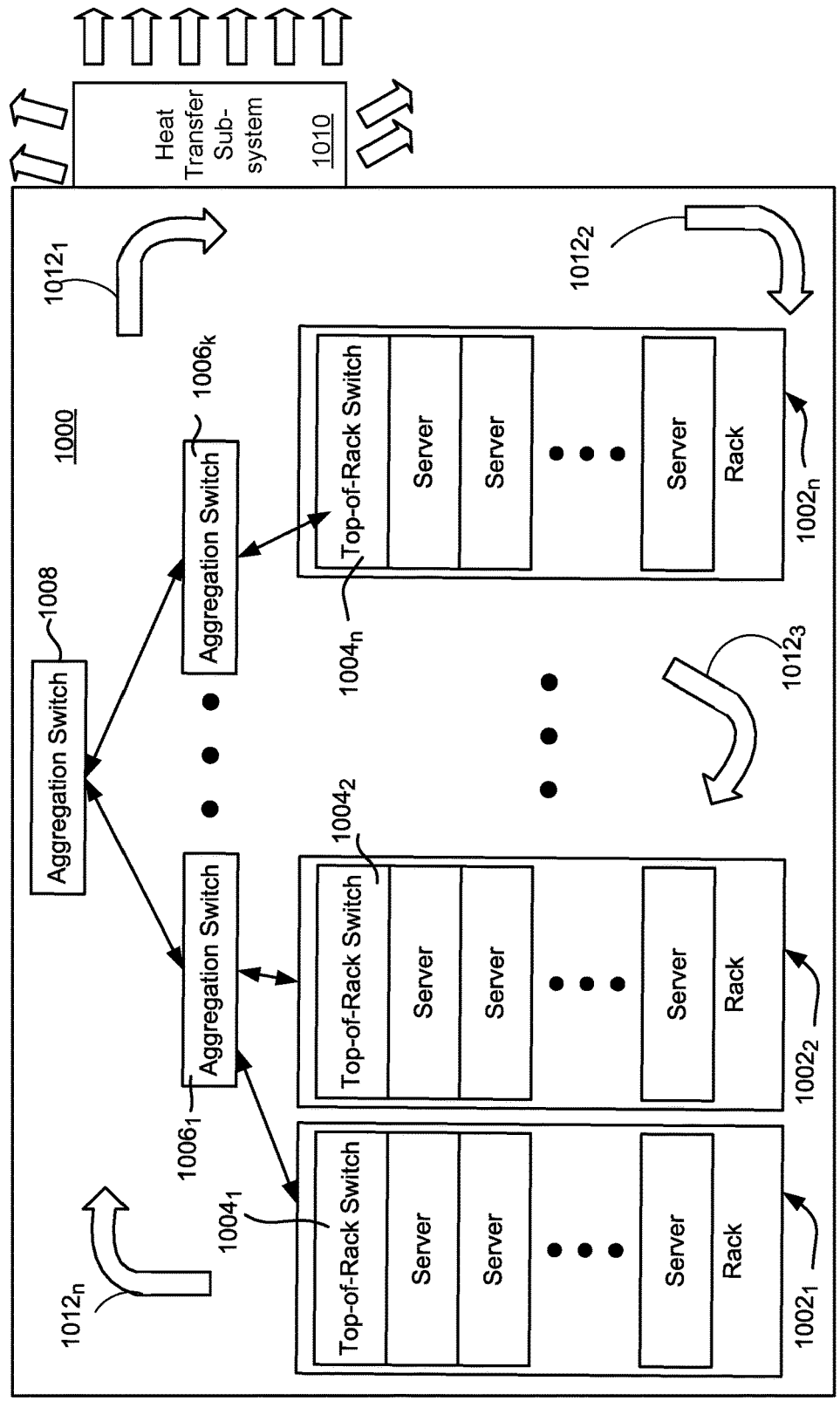

US 10,285,309 B2

SUBMERGED DATACENTER

CROSS-REFERENCE TO RELATED APPLICATION

The present application is a continuation of U.S. application Ser. No. 14/319,926 filed on Jun. 30, 2014 and is hereby incorporated by reference herein for all intents and purposes.

BACKGROUND

As cloud-based computing and cloud-based services grow, datacenters need to be provided to serve client customers. Customers want fast speeds (lowest possible latency) for their cloud applications. In order to satisfy customers, future datacenters need to be positioned as close as possible to the customer base. At the same time, consideration needs to be given to privacy, security, environmental conditions, real estate availability, access to power, cost of power and so on.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, one or more of various aspects of the subject matter described herein are directed towards a datacenter configured for operation while submerged in water. The datacenter's electrical components are in a sealed container. The datacenter is cooled at least in part by the water.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which:

FIGS. 3A and 3B are example representations of submerged datacenter modules arranged in three-dimensions, according to one or more example implementations.

FIG. 10 is a block diagram representing an example datacenter cooled by circulating gas/fluid containing/computing device into which one or more aspects of various embodiments described herein can be implemented.

DETAILED DESCRIPTION

Various aspects of the technology described herein are generally directed towards providing and/or deploying a datacenter (generally a facility comprising centrally managed computing resources and related support systems) that is designed to be submerged, for example on the ocean floor or the floor of any similar deep body of water, such as a lake, river, flooded former quarry and so on. The datacenter may be deployed relatively close to current and potential customers, and positioned in a way to take advantage of sustainable power that is also environmentally friendly, and take advantage of the massive heat sink provided by the water. By positioning the datacenter in deep water, such as anchoring it or sinking it to the ocean floor, the risks of umbilical detachment or damage to the datacenter by external forces are significantly reduced.

It should be understood that any of the examples herein are non-limiting. For example, ocean-submerged datacenters are exemplified, as is the concept of positioning datacenters on the ocean floor, e.g., by sinking them. However, bodies of water other than the ocean provide similar benefits, and anchoring rather than sinking may be used, such as if the ocean floor is too uneven at an otherwise desired location. As used herein, "floor" refers to the bottom of any body of water, e.g., the ocean floor, a riverbed, seabed, lake bottom and so on. As such, the present invention is not limited to any particular embodiments, aspects, concepts, structures, functionalities or examples described herein. Rather, any of the embodiments, aspects, concepts, structures, functionalities or examples described herein are non-limiting, and the present invention may be used in various ways that provide benefits and advantages in datacenters and computing in general.

Figure 1:
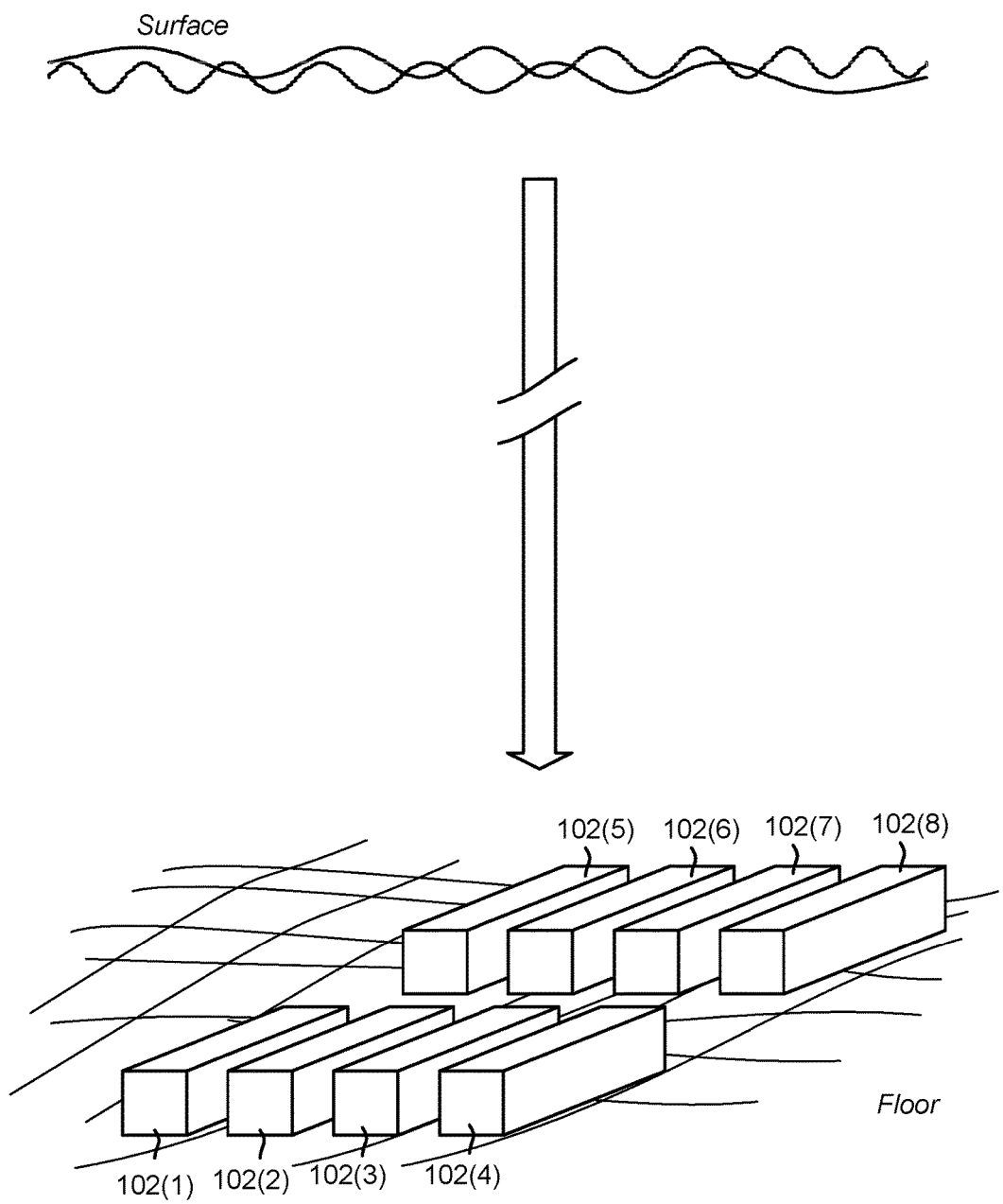
FIG. 1 is an example representation of a submerged datacenter (configured in a plurality of modules) resting on the floor of a body of water, according to one or more example implementations.

As generally represented in the example implementation of FIG. 1, a number of (e.g., modular) datacenter modules 102(1)-102(8) may be submerged to rest on the floor of any body of water. Modularity is not necessary, however modularity has some advantages, including being able to size a datacenter to different populations via using an appropriate number of modules, replacement at the end of a module lifecycle, portability, security (e.g., modules can be divided into public modules or private modules, with no communication between them, and so on. Further, modularity allows for ease of manufacturing; it takes almost two years to develop and deploy a custom datacenter, which may be disadvantageous in many situations, and modularity can speed up the deployment while lowering the prices.

With respect to deployment, a datacenter module may be towed to its desired location, coupled to cabling and any other datacenter modules, and sank in any number of ways, such as by attaching weight, adding water to a ballast tank, and so forth. In the event that the datacenter module may need service or replacement, the weight may be removed to allow the datacenter to float. Note that at depths below conventional human diving capability, machinery may be needed to remove the weight/attach a pipe to pump air in and the water out of the ballast tank. Similarly, any components that are more likely to need servicing, such as those with moving parts like pumps, may need redundancy and/or be designed to be externally detachable.

Figure 2:
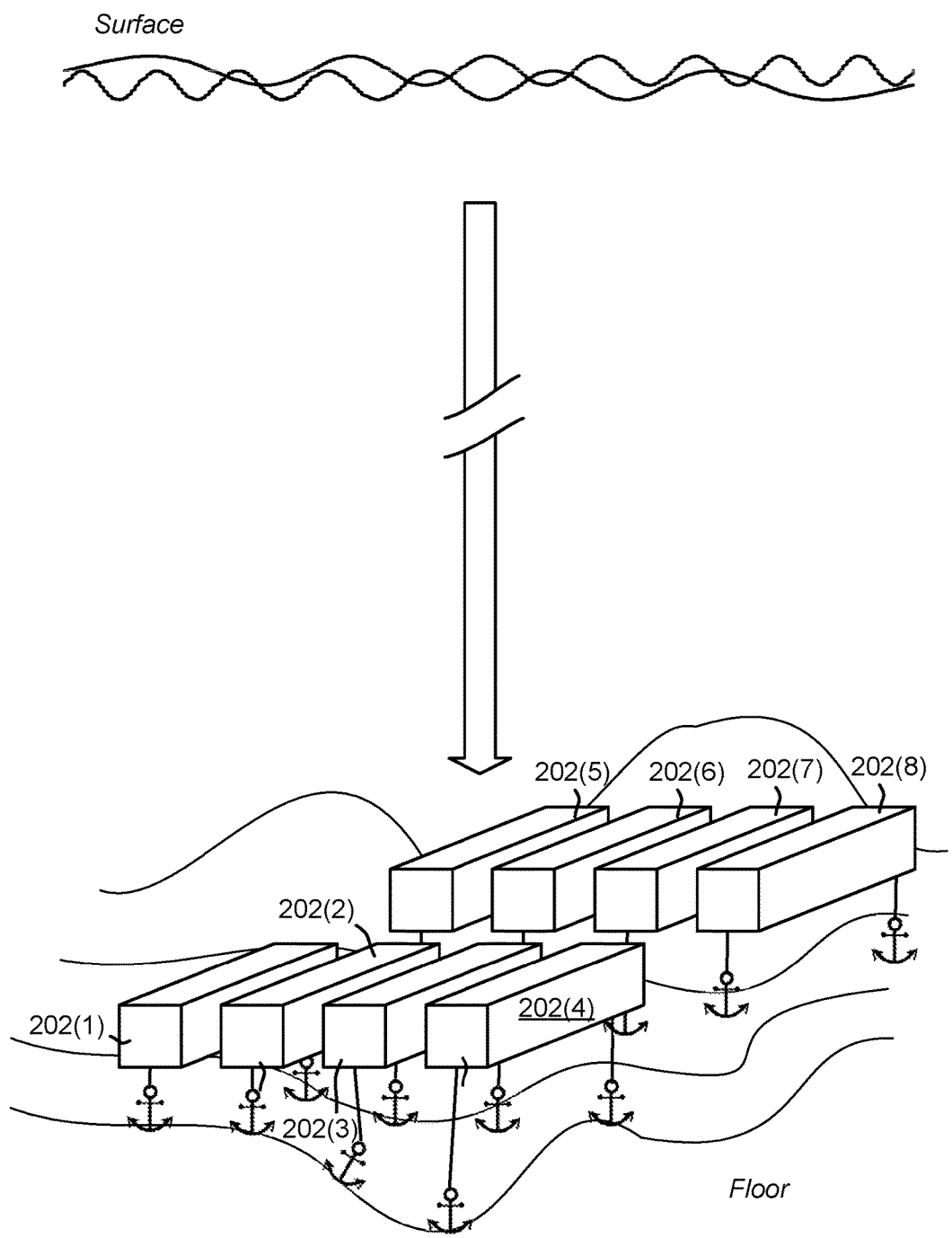
FIG. 2 is an example representation of partially submerged datacenter modules anchored to the floor of a body of water, according to one or more example implementations.

FIG. 2 shows an alternative implementation, in which datacenter modules 202(1)-202(8) are slightly buoyant on their own, but via anchoring are anchored to the floor in a desired orientation and pattern, e.g., level and evenly distributed in a line or arrayed pattern. As can be readily appreciated, anchoring facilitates deployment of datacenters to floors with irregular terrain. Note that the depths may be pre-mapped so that the anchor chains or the like may be designed with a suitable length to keep the datacenters at a desired orientation. In general, a submerged datacenter needs to be securely anchored (by its own weight as in FIG. 1 or by heavy attached weight as in FIG. 2) to avoid shifting position and detaching from the (electrical and fiber internet) service cabling.

As is understood, the depiction of eight modules in FIGS. 1 and 2 is an arbitrary number merely for purposes of illustration. For example, a single datacenter may be submerged, (which need not be modular), up to any practical number.

Cabling is not shown in FIGS. 1 and 2, but as is understood, a power source and (e.g., fiber) data communication connections are coupled to each datacenter module. Moreover, any or all of the datacenter modules, e.g., 102(1)-102(8) or 202(1)-202(8), may be coupled to one another for highly efficient internal communication including by any wired or wireless connections. In the event that power is coming from land, the cabling can be arranged such that a single jacket surrounds both the power cable and fiber optic communication cabling, whereby only one reel need be used, and the different cables cannot get in each other's way during deployment. Further, at least some of the communication signals can be transmitted/received through the power cable.

FIGS. 3A and 3B show configurations of datacenters composed of submerged modules in a three-dimensional array. Some example spacing is shown between modules to facilitate cooling, however such spacing between modules may be unnecessary.

Figure 4:
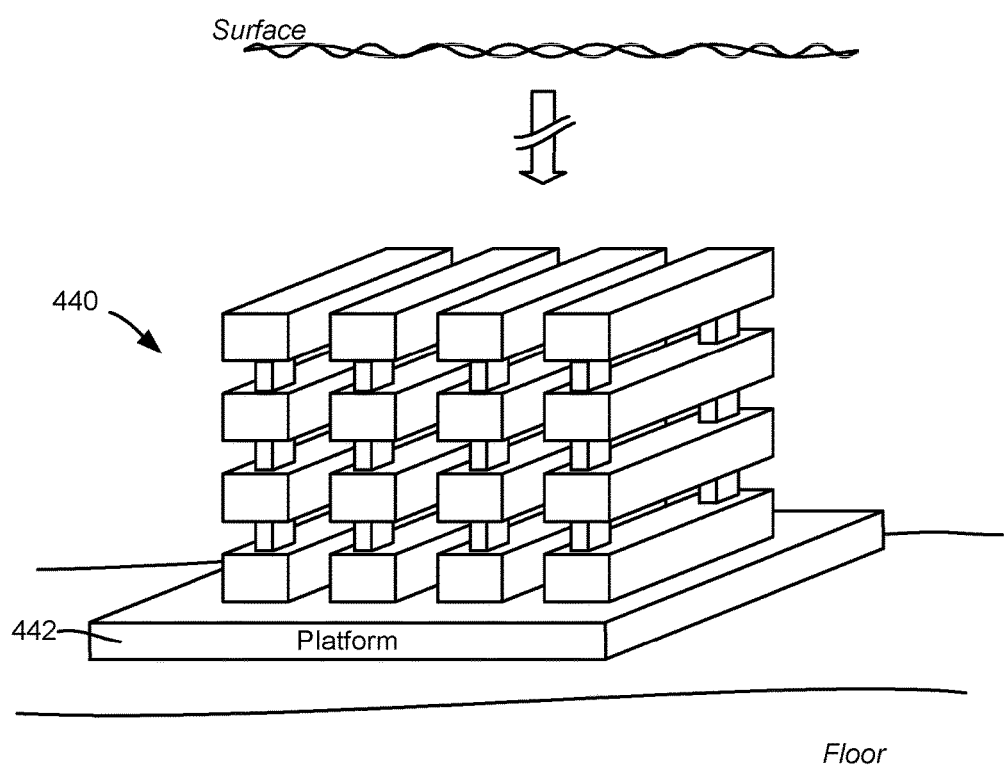
FIG. 4 is an example representation of submerged datacenter modules arranged to be assembled on and sink with a platform, according to one or more example implementations.

FIG. 4 shows another alternative, which is to assemble the datacenter modules 440 on a platform 442 that is controllably sunk, e.g., upon completion of the assembly operation. The platform 442 may be designed to float at first, and become partially submerged as weight from the datacenter modules is added. Alternatively, the platform 442 may be lowered by filling it with water. The platform may be self-leveling.

Among other advantages of submerged datacenters, a large percentage of the world's population lives near the ocean or other relatively deep body of water, whereby submerging the datacenter provides close positioning of the datacenters to users, e.g., customers and/or a private enterprise's employees. Further, unlike floating datacenters, advantages are obtained from being below the water surface, particularly at a relatively deep depth. For example, floating datacenters are exposed to a variety of risks that can cause loss of power and service connections, including being prone to weather (ocean storms, wind, waves, floating objects, electrical strikes), tidal and ocean currents that cause normal ocean swell (which stress the connections to electrical power and the fiber internet backbone), accidents from commercial shipping, fishing and pleasure boat traffic, being easy to spot from the air or ocean surface and thus easier to target and/or board, increasing the risk of piracy, vandalism, sabotage or espionage.

Still other advantages include that for privacy and security concerns, some governments specify that their cloud services data be stored in their own country. Serving multiple countries from a Regional "Mega-Datacenter" is thus not always an option. At other times it may be advantageous to deploy a datacenter in international waters.

In general, the deeper the datacenter is submerged, the less vulnerable the datacenter to such risks. Indeed, many land-based datacenters are not built to withstand severe weather and are at risk of damage or failure from threats like tidal surges, flooding and other wind/water damage.

Note that a partially-submerged datacenter and/or one submerged in relatively shallow water is susceptible to ocean currents, fishing nets, anchors and submarines in a manner that risks impact or detachment from its source of power and internet. Notwithstanding, in some situations a partially-submerged datacenter and/or one submerged in relatively shallow water may be desirable, and thus the technology described herein as "submerged" also applies to partially-submerged datacenters and/or datacenters submerged in relatively shallow water. As but one example, a datacenter may be partially submerged or submerged in relatively shallow water above or below a waterfall; the waterfall may provide the power, and the submersion the cooling.

Any number of ways to provide power to a submerged datacenter may be used, including running power from conventional land-based sources. However, there are also opportunities to use power sources deployed in water, including ocean-based power sources such as power generated from tidal or ocean currents; in general, it reduces cost to generate power near its usage.

Figure 5A:
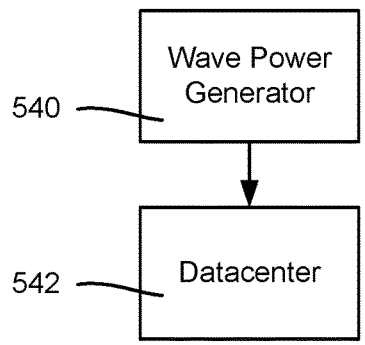
FIGS. 5A-5C are block diagrams representing examples of water-based power sources coupled to provide at least some needed power to a datacenter, according to one or more example implementations.
Figure 5B:
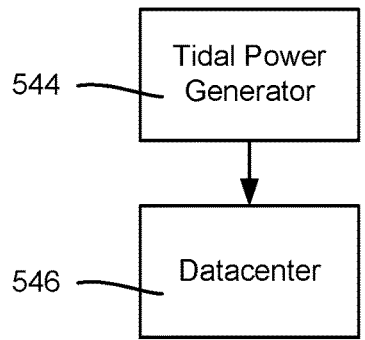

Wave power 550 is exemplified in FIG. 5A as powering a datacenter 552, and tidal power 554 in FIG. 5B as powering a datacenter 556; tidal power is very predictable. Solar power is another suitable alternative, although possibly as a supplement to other sources in datacenters where many megawatts are needed. Nuclear, fusion and so on may be used. Indeed, any power sources may be used, combined, and so on. Power generation capacity may be stored for times when the energy sources are lower, e.g., when variable power such as based upon tides, ocean currents and/or waves is plentiful, hydrogen can be separated from water for use in fuel cells that are later used for power when needed. If a power connection to the power grid exists, excess power can be sold, and/or if an emergency occurs that knocks out a land-based power source, datacenter consumption may be reduced with the ocean-provided power being output for other purposes. Note that deuterium may be processed near the submerged datacenter and used to provide power; the heat of the datacenter may be used to help in the processing.

Figure 5C:
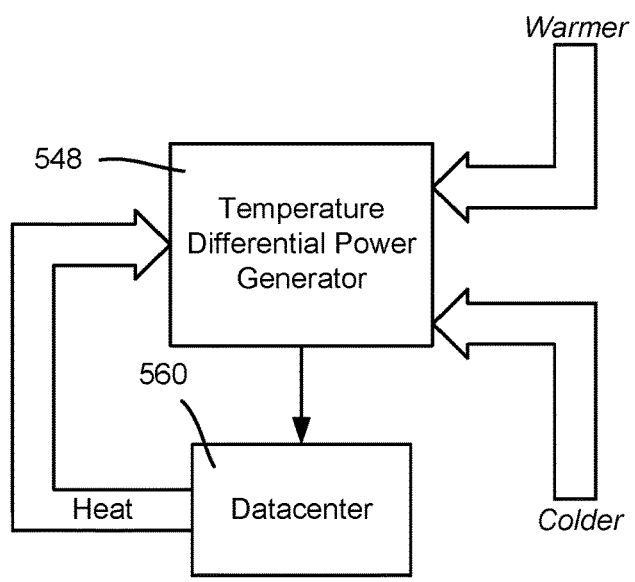

FIG. 5C shows the use of power generation via a generator 558 that is based upon temperature differences, via water nearer the surface that is warmer than water that is deeper. In FIG. 5C, heat generated by a datacenter 560 may be used to increase the temperature differential, for example.

Figure 6:
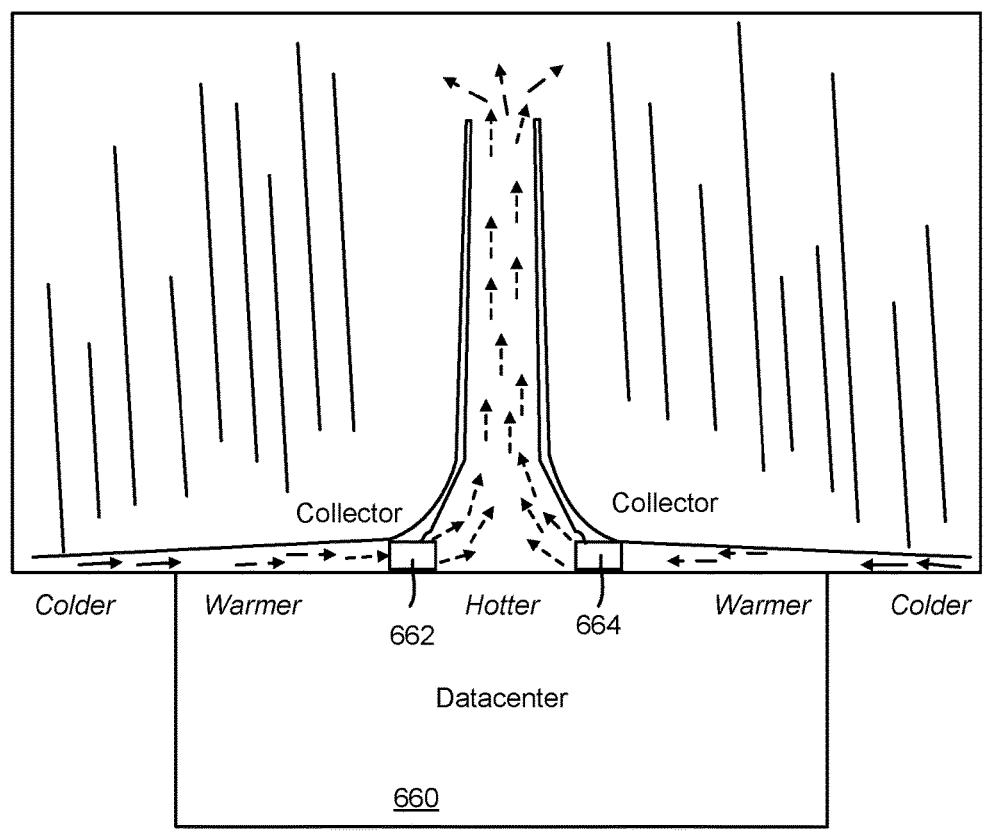
FIG. 6 is an example representation of a submerged datacenter having heat generated thereby used to generate power, according to one or more example implementations.

Another way to use heat is to more directly generate power from it. For example, as shown in FIG. 6, the heat rising from a datacenter 660 may be captured and used to power turbines (e.g., two are shown, labeled 662 and 664). A gas may be selected for use with the datacenter heat and surrounding water temperatures to as to change from gas to a liquid and vice-versa at the desired temperatures, for example. In any event, the datacenter is cooled by the water, whether directly or indirectly by having its heat transferred to another mechanism, such as shown in FIG. 6.

Figure 7:
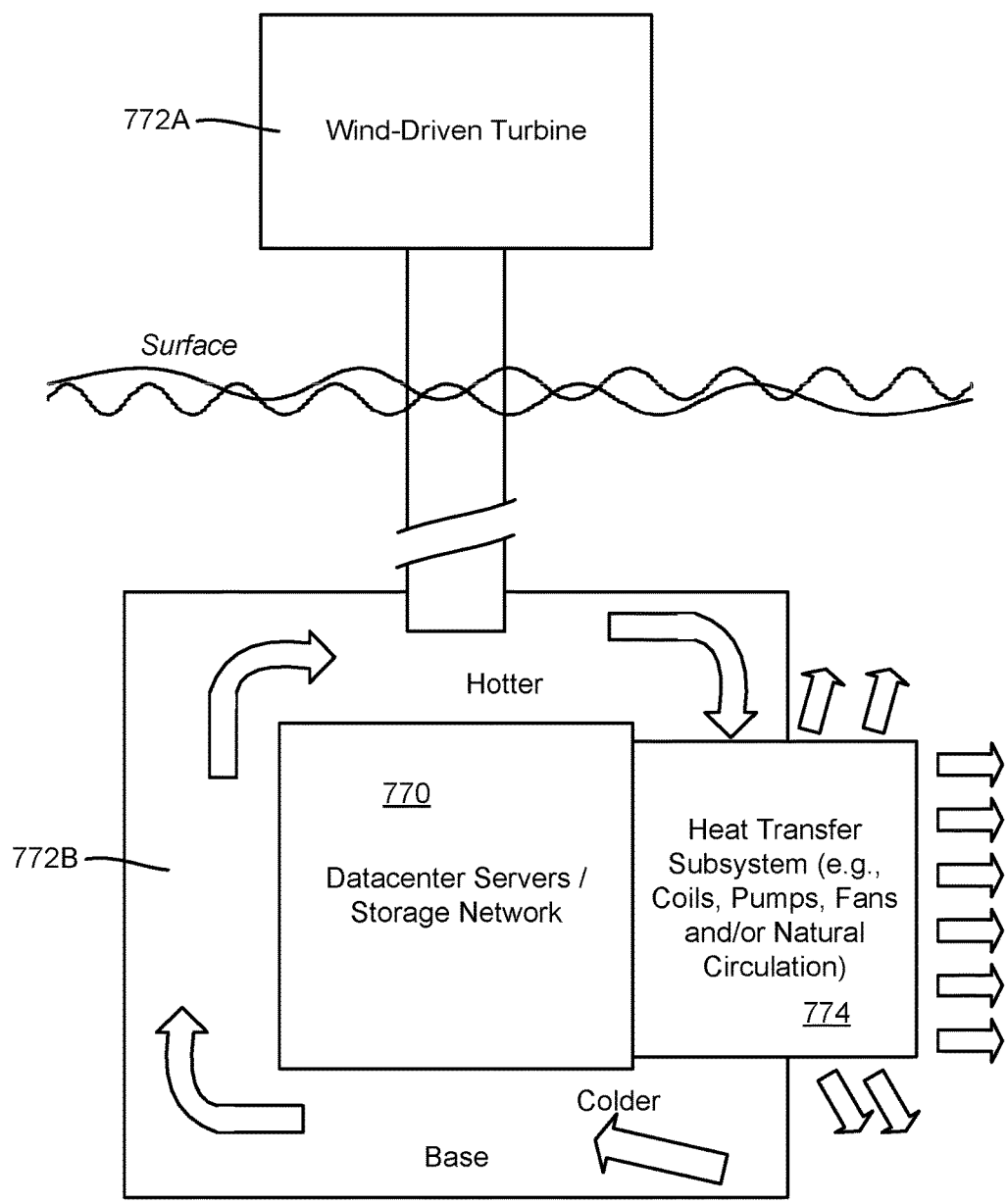
FIG. 7 is an example representation of a datacenter coupled to or incorporated into the base of a wind-driven turbine, according to one or more example implementations.

FIG. 7 shows the deployment of a datacenter 770, or at least part of a datacenter, coupled to an offshore wind turbine power generator 772 (with a turbine 772A and base 772B). If the base 772B is designed to contain water, the datacenter may be incorporated into (submerged in) the base. Note that antennas may be arranged near the turbine 772A that may transmit some of the communications, including to land and/or to other modules similarly deployed. Note that any submerged or partially power generation system may likewise have a datacenter coupled thereto or incorporated into it.

FIG. 7 also shows how heat may be transferred from the datacenter 770 to the water via a heat transfer subsystem 774, including any pumps, fans, heat transfer coils and/or the like. Gas or fluid may be circulated through the datacenter/module 770, and/or water from the outside environment may be pumped (or pulled naturally as heat rises) through sealed pipes passing through the module 770. Any datacenter filled with servers, storage and network equipment, as well as any fans or pumps, generates heat, and that heat needs to be transferred away from the equipment, otherwise the hardware is at risk of overheating and failing. However, this heat can cause environmental impact and consideration is given to disbursing the heat in a way that mitigates adverse affects. For example, the datacenter would not be deployed near an environmentally sensitive area such as a reef.

Cooling may be based upon circulating gases or fluids via fans or pumps. However, non-moving parts may be used instead of or in addition to fans or pumps, which have moving parts and thus more susceptible to failure. For example, heat pipe technology and/or other technologies that use the natural rising of vapor and or heat in a closed system may be used for cooling.

Figure 8A:
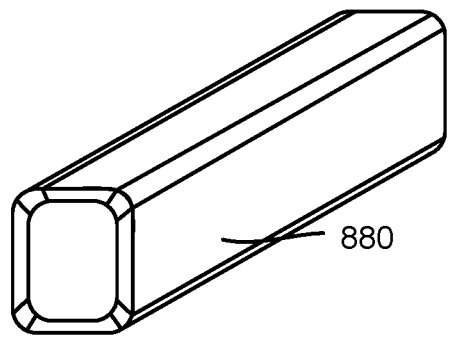
FIGS. 8A and 8B are example representations of how a module may be designed for strength and protection, according to one or more example implementations.

Depending on the depth at which the datacenter is submerged, consideration needs to be given to the water pressure. One way to make the datacenter stronger against failure is to use chamfered edges/corners instead of right angles on each of the modules, as generally represented in the module 880 of FIG. 8A. This also may help avoid fishing nets and the like from snagging a module, although another alternative for protecting the module(s) to avoiding snagging, collisions and so forth is to cover one or a group of modules with a housing, such as a hemispherical dome pr the like.

Figure 8B:
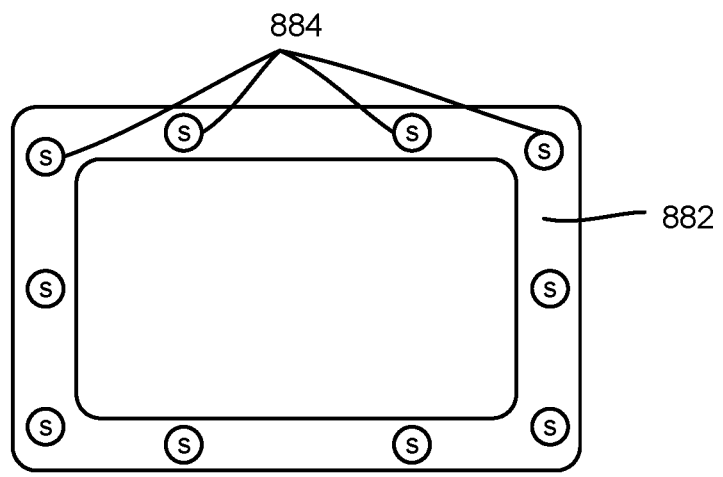

A double hull design may be used, as generally represented in FIG. 8B. Water intrusion may be detected by a sensor set 884 (any of one or more various sensors "s" in FIG. 8B) in the space 882 between the hull portions. Pressure changes may likewise be sensed. Note that the space 882 between the inner and outer hull may be filled with a dielectric fluid whose resistance will change with any water intrusion, whereby sensors can detect if there is a leak, and indeed, the rate of change can be evaluated to determine whether a slow or significant leak is occurring. More than two hulls (portions) may be used for further protection.

The datacenter/datacenter modules need to be sealed to be leak-proof and resist corrosion (particularly in saltwater deployments) for at least the planned life thereof. Metals can be coated with polymers and so forth, for example, or the modules may be built from polymers. Note that the electrical components actually need to be sealed from water intrusion, and may be put into a sealed container (or containers) within the module for example.

Still further, as generally described in copending patent application entitled "Datacenter with Immersion Cooling Liquid" 14/320,019, the interior of the datacenter (and any space between multiple hulls) may be filled with a dielectric fluid other than air. This provides for equalized pressure (or substantially equalized), and by circulating the fluid, transfers heat away from the components. Note that with such equalized pressure, the hull or hulls need not be particularly thick or even made of metal, which facilitates the use of materials having good corrosion resistance properties.

Figure 9:
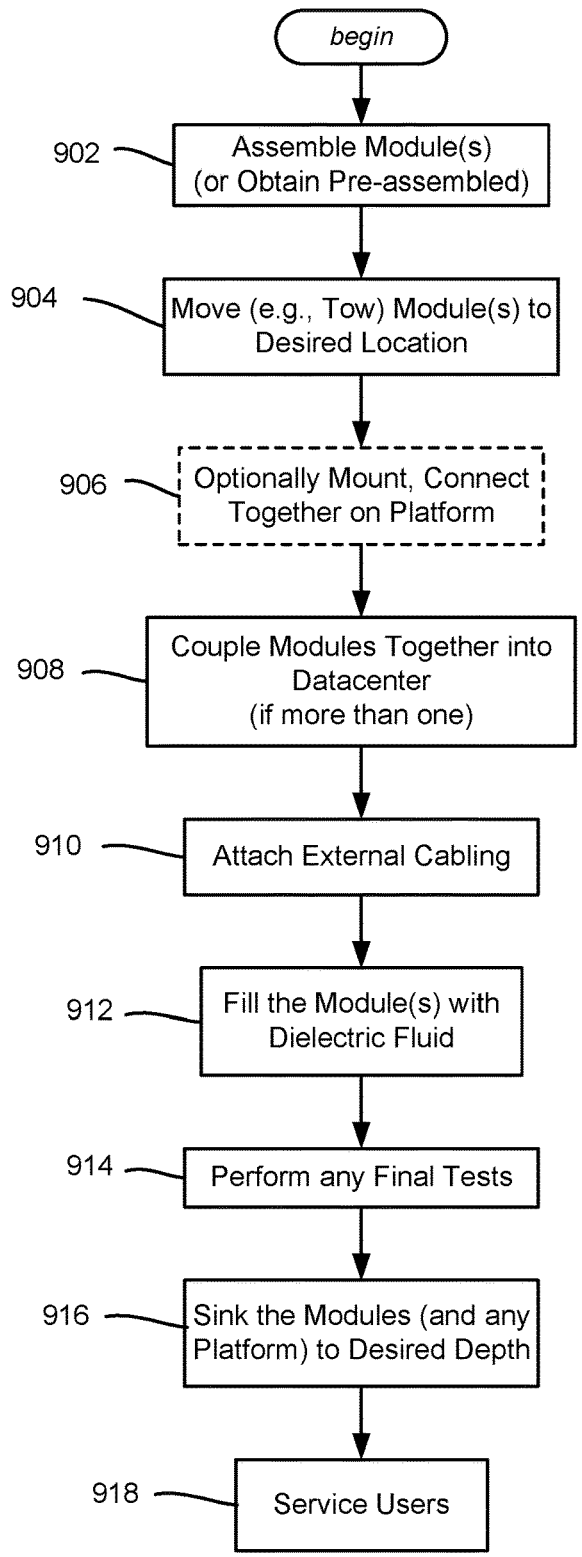
FIG. 9 is a flow diagram comprising example steps that may be used in deploying a submerged datacenter, according to one or more example implementations.

FIG. 9 is a flow diagram showing example steps related to deploying a submerged datacenter. In the example of FIG. 9, modules are used as examples, however it is understood that an entire datacenter may be contained in one housing, and thus a single "module" may serve as a datacenter. Indeed, where population/demand for cloud services is not too great, a single module (as thought of in the conventional sense) may suffice to serve a region.

Step 902 represents assembling the module(s), whether done at a factory or (at least to an extent) on site. Step 904 moves the modules to the desired location, such as by towing them, or towing a platform that supports them. If a platform is used (step 906), the modules may be pre-configured for use and towed on the platform, or lifted onto the platform, mounted thereto or to each other and assembled for use (e.g., coupled together and/or to the platform as desired) on the platform. Any coupling (e.g., step 908) may be physical coupling to fasten the modules together and/or to the platform for stability, as well as electrical coupling for module communications with each other to provide a datacenter from component modules.

Step 910 represents attaching the external cabling to the modules, which includes the fiber communications cable to the land, and any power connection. Note that the power connection may be made to an underwater power source, and thus the power cabling may be coupled to the datacenter modules underwater, after the modules are submerged (or while they are being submerged).

Step 912 represents filling the modules with dielectric fluid, (if fluid filled modules are to be used in an given scenario). Note that it is likely advantageous to fill the modules after moving them to keep them lighter, make them towable (e.g., floatable) and so on. Note that upon retrieval, the dielectric fluid may be emptied before securing for return shipping; this may be by pumping the fluid out of the module (which may lighten the module which will help in floating and/or reeling the module back to the surface), or by emptying a reeled-in full module after being reeled back to the surface.

Step 914 represents performing any final tests or inspections that may be desirable to perform before sinking the datacenter; (note that some of the tests may be conducted before filling the modules with dielectric fluid at step 912). However, other tests such as leak tests may be performed with dielectric fluid in the modules.

Step 916 represents sinking the datacenter or datacenter portions along with the platform, if any, that the datacenter is on. Note that the sinking operation may leverage the filling of the modules with fluid, that is, the weight of the dielectric fluid may be used to sink the datacenter and/or platform. Step 914 represents using the submerged datacenter to service users.

Note that the above example steps need not occur in the order shown. For example, it may be desirable to sink the datacenter modules, at least partially, before connecting the cabling. Indeed, in a situation where more capacity is needed, one or more additional modules may be sunk next to an existing submerged datacenter, and coupled thereto. This further allows for rotating new modules into a datacenter as older ones are removed, e.g., detached and floated up for recycling.

As can be seen, there is described a technology in which a datacenter is configured for operation while submerged in water, including by having electrical components in a sealed container. The datacenter is cooled at least in part by the water.

The datacenter may comprise a plurality of modules, each module configured for submersion in water. The modules may be arranged in an array.

The datacenter may incorporate or be coupled to at least one pump and/or fan, to circulate gas and/or to cool the datacenter by transferring heat to the water and/or to another mechanism (e.g., for power generation).

The datacenter may receive at least some power generated by the water, e.g., from waves, water current, and/or tide changes. The power generated by the water may be based upon the temperature difference between colder water and warmer water, and at least some heat generated by the datacenter may used to increase the temperature difference. At least some heat generated by the datacenter may be used to generate power more directly.

The datacenter may be positioned on a platform, and submerged with the platform. The datacenter may be coupled to or incorporated into a submerged based of a wind-driven turbine, or other power generation system.

In one or more aspects, a datacenter module is configured for submersion in water, with the datacenter module including electrical components contained in a sealed hull. A heat transfer subsystem is configured to transfer heat away from the hull.

The hull may comprise at least two hull portions with spacing between each portion. A sensor set (one or more sensors) may be located within the spacing between two of the portions to detect any water intrusion. The hull may include chamfered edges.

At least part of the heat transfer subsystem may use the hull surface to transfer heat to the water. The heat transfer subsystem may include at least one pump and/or fan to circulate fluid and/or gas within the hull. The heat transfer subsystem may transfer at least some heat away from the hull for use in generating power.

One or more aspects are directed towards deploying a submerged datacenter, including positioning at least part of the datacenter at a desired location over a body of water, and sinking the at least part of the datacenter. Sinking the at least part of the datacenter may comprise adding weight to the at least part of the datacenter and/or to a platform that supports the at least part of the datacenter. Once submerged, the datacenter is operated for servicing users.

Example Datacenter Environment

One of ordinary skill in the art can appreciate that the various embodiments and methods described herein can be implemented in connection with any number of hardware devices, which can be deployed as part of a datacenter or other computing environment, and can be connected to any kind of data store or stores. Thus, the technology is not limited to a datacenter in the conventional sense, but may be used in any situation where computing power is needed near a certain location and heat dissipation is a consideration.

FIG. 10 shows an example submerged datacenter 1000 (or one datacenter module) that is exemplified as having a tree-like topology. A plurality of racks $1002_1$-$1002_n$ each have servers, which communicate through a top of rack switch $1004_1$-$1004_n$. The servers may include storage, or at least part of the storage may be separately located. A typical network has twenty to forty servers per rack, with increasingly powerful links and switches going up the tree. Note that datacenters are not limited to tree-like topologies, but can be used in any topology. A small amount of the computing power may be used to monitor the submerged datacenter sensors, run any fans, pumps and so on, operate an active leveling system, and so on, although this may be done with separate machine logic.

As represented in FIG. 10, each top of rack switch $1004_1$-$1004_n$ is coupled to one another through one or more aggregation switches $1006_1$-$1006_k$. In this way, each server may communicate with any other server, including a server in a different rack. Note that in this example, a higher-level aggregation switch 1008 couples the rack-level aggregation switches $1006_1$-$1006_k$, and there may be one or more additional levels of aggregation switch couplings.

As represented in FIG. 10 by the rounded arrows $1012_1$-$1012n$, the exemplified datacenter has gas and/or dielectric fluid circulated throughout, which may be via pumps, fans and/or natural circulation. A heat transfer subsystem 1010, which may use coils, radiators, fluid pumps, fans and so forth transfers heat away from the datacenter/module to the surrounding water and/or for use in power generation. Note that a module's or datacenter's hull itself may be used as a heat transfer mechanism.

CONCLUSION

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

In addition to the various embodiments described herein, it is to be understood that other similar embodiments can be used or modifications and additions can be made to the described embodiment(s) for performing the same or equivalent function of the corresponding embodiment(s) without deviating therefrom. Still further, multiple processing chips or multiple devices can share the performance of one or more functions described herein, and similarly, storage can be effected across a plurality of devices. Accordingly, the invention is not to be limited to any single embodiment, but rather is to be construed in breadth, spirit and scope in accordance with the appended claims.

What is claimed is:

1. A datacenter module configured for submersion in water, the datacenter module comprising: a sealed double hull comprising:
   a first hull portion; and a second hull portion surrounding the first hull portion with a space between the first hull portion and the second hull portion; a dielectric fluid implemented within the space between the first hull portion and the second hull portion, wherein the dielectric fluid is sealed within the space before the space is submerged;
   a sensor set implemented within the space between the first hull portion and the second hull portion and detecting a change in pressure and resistance of the dielectric fluid; a plurality of electrical components implemented within the first hull portion; and a heat transfer subsystem coupled to the sealed double hull that transfers heat away from the datacenter module submerged in the water to the water outside the second hull portion, wherein the heat transferred away from the datacenter powers at least one power generator.

2. The datacenter module of claim 1, wherein the second hull portion includes chamfered edges.

3. The datacenter module of claim 1, wherein the first hull portion is sealed to contain the plurality of electrical components, and wherein the second hull portion is sealed to contain the dielectric fluid.

4. The datacenter module of claim 1, wherein at least one sensor of the sensor set detects a resistance of the dielectric fluid, and wherein a change in the detected resistance of the dielectric fluid indicates a leak.

5. The datacenter module of claim 1, wherein the detected change in the pressure indicates a leak.

6. The datacenter module of claim 1, wherein at least one sensor of the sensor set detects a rate of change of at least one of the detected change in pressure or the detected change of resistance of the dielectric fluid.

7. The datacenter module of claim 1, wherein the first hull portion further includes a dielectric fluid that transfers heat away from the plurality of electrical components.

8. The datacenter module of claim 1, wherein the first hull portion further includes a dielectric fluid that equalizes a pressure of the first hull portion.

9. The datacenter module of claim 1, further comprising:
a heat transfer subsystem that transfers heat away from the second hull portion to the water in which the datacenter module is submerged.

10. A system comprising:
a submersible datacenter having a sealed double hull, a first portion of the sealed double hull including a sealed container comprising a plurality of electrical components, a second portion of the sealed double hull including a sealed container surrounding the first portion of the sealed double hull and comprising a set of sensors detecting a change in pressure and resistance of a dielectric fluid disposed within a space between the first portion and the second portion of the sealed double hull, wherein the dielectric fluid is sealed within the space before the space is submerged; and
a heat transfer subsystem coupled to the sealed double hull that transfers heat away from the submersible datacenter to water outside the second portion of the sealed double hull, wherein the heat transferred away from the datacenter powers at least one power generator.

11. The system of claim 10, wherein the heat transfer subsystem further comprises a radiator that transfers heat from an environment within the space between the first portion and the second portion of the sealed double hull to an environment outside the submersible datacenter.

12. The system of claim 10, wherein the first portion of the sealed double hull including the sealed container comprising the plurality of electrical components further comprises dielectric fluid circulated to transfer heat away from the plurality of electrical components.

13. The system of claim 10, wherein the second portion of the sealed double hull further includes chamfered edges.

14. The system of claim 10, wherein at least one sensor of the set of sensors detects a resistance of the dielectric fluid disposed within the space between the first portion and the second portion of the sealed double hull, and wherein a change in the detected resistance of the dielectric fluid indicates a leak.

15. The system of claim 10, wherein at least one sensor of the set of sensors detects a pressure within the space between the first portion and the second portion of the sealed double hull, and wherein a change in the detected pressure indicates a leak.

16. The system of claim 10, wherein at least one sensor of the set of sensors detects a rate of change of at least one of a detected pressure or a detected resistance of the dielectric fluid disposed within the space between the first portion and the second portion of the sealed double hull.

17. A method for detecting a leak in a submerged datacenter, the method comprising:
monitoring, with one or more sensors implemented within a sealed space disposed between a first portion and a second portion of a sealed double hull, a dielectric fluid implemented within the sealed space, the first portion surrounding the second portion to form the sealed double hull of the submerged datacenter, wherein the dielectric fluid is sealed within the sealed space before the sealed space is submerged;
detecting, with the one or more sensors, a change in resistance of the dielectric fluid within the sealed space; and
determining, based on the detected change in resistance, whether a leak is present in the sealed double hull of the submerged datacenter; and
transferring heat away from the submersible datacenter, via a heat transfer subsystem, to water outside the second portion, wherein the heat transferred away from the datacenter powers at least one power generator.

18. The method of claim 17, further comprising:
detecting, with the one or more sensors, another change in resistance of the dielectric fluid within the space; and
based on the detected change and the other detected change, determining a rate of change in resistance of the dielectric fluid to determine whether the leak is slow or significant.

19. The method of claim 17, wherein the change in resistance of the dielectric fluid indicates water intrusion in the space between the first portion and the second portion of the sealed double hull.

20. The method of claim 17, further comprising:
detecting, with the one or more sensors, a change in pressure within the space between the first portion and the second portion of the sealed double hull; and
determining, based on the detected change in pressure, whether a leak is present in the sealed double hull of the submerged datacenter.

* * * * *